US011355540B2

(12) United States Patent
Lin et al.

(10) Patent No.: US 11,355,540 B2
(45) Date of Patent: Jun. 7, 2022

(54) OPTICAL DEVICE

(71) Applicant: VisEra Technologies Company Limited, Hsin-Chu (TW)

(72) Inventors: Kuo-Feng Lin, Kaohsiung (TW); Chin-Chuan Hsieh, Hsin-Chu (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 140 days.

(21) Appl. No.: 16/849,094

(22) Filed: Apr. 15, 2020

(65) Prior Publication Data

US 2021/0327928 A1 Oct. 21, 2021

(51) Int. Cl.
*H01L 27/146* (2006.01)
*H01L 31/0224* (2006.01)
*H01L 31/0376* (2006.01)
*H01L 31/105* (2006.01)
*H01L 27/144* (2006.01)
(Continued)

(52) U.S. Cl.
CPC .......... *H01L 27/1462* (2013.01); *H01L 27/14* (2013.01); *H01L 27/1446* (2013.01); *H01L 27/14643* (2013.01); *H01L 31/022466* (2013.01); *H01L 31/0376* (2013.01); *H01L 31/035281* (2013.01); *H01L 31/1055* (2013.01)

(58) Field of Classification Search
CPC .......... H01L 27/1462; H01L 27/14643; H01L 31/022466; H01L 31/0376; H01L 31/035281; H01L 31/1055; H01L 27/14; H01L 27/1446

USPC ......................................................... 257/432
See application file for complete search history.

(56) References Cited

U.S. PATENT DOCUMENTS

2004/0157354 A1* 8/2004 Kuriyama ............ G02B 6/1225
438/45
2010/0022499 A1 1/2010 Gilon
2010/0127153 A1 5/2010 Agarwal
(Continued)

FOREIGN PATENT DOCUMENTS

CN 104737319 A 12/2017
CN 105556680 B 12/2017
(Continued)

OTHER PUBLICATIONS

Office Action dated Sep. 28, 2021 in JP Application No. 2020-136202, 7 pages, w/English translation.
(Continued)

*Primary Examiner* — David Vu
*Assistant Examiner* — Brandon C Fox
(74) *Attorney, Agent, or Firm* — Muncy, Geissler, Olds & Lowe, PC

(57) ABSTRACT

An optical device includes a first conductive layer, a first junction layer, a light absorption layer, a second junction layer, and a second conductive layer. The first junction layer is disposed on the first conductive layer. The light absorption layer is disposed on the first junction layer, wherein the light absorption layer includes a plurality of unit cells, each of the unit cells includes a plurality of pillar structures, and the pillar structures of each of the unit cells are different sizes. The second junction layer is disposed on the light absorption layer. The second conductive layer is disposed on the second junction layer.

18 Claims, 15 Drawing Sheets

(51) Int. Cl.
*H01L 31/0352* (2006.01)
*H01L 27/14* (2006.01)

(56) References Cited

U.S. PATENT DOCUMENTS

| | | | |
|---|---|---|---|
| 2011/0041900 A1 | 2/2011 | Park et al. | |
| 2013/0270517 A1* | 10/2013 | Nozawa | H01L 33/04 257/13 |
| 2014/0166100 A1* | 6/2014 | Watanabe | H01L 31/02366 136/256 |
| 2016/0111460 A1 | 4/2016 | Wober | |
| 2016/0197206 A1* | 7/2016 | Lim | H01L 31/035227 136/255 |
| 2016/0204283 A1 | 7/2016 | Patolsky et al. | |
| 2016/0240580 A1* | 8/2016 | Xian | H01L 27/14607 |
| 2019/0267417 A1* | 8/2019 | Peng | H01L 27/14629 |

FOREIGN PATENT DOCUMENTS

| | | | |
|---|---|---|---|
| JP | 2013239690 A | 11/2013 | |
| JP | 2014022499 A | 2/2014 | |
| JP | 2014049652 A | 3/2014 | |
| JP | 2015532725 A | 11/2015 | |
| JP | 2017059739 A | 3/2017 | |
| JP | 2017120816 A | 7/2017 | |
| TW | 201133907 A | 10/2011 | |
| TW | 201727928 A | 8/2017 | |
| TW | 201834231 A | 9/2018 | |
| TW | 202008570 A | 2/2020 | |
| WO | WO-2012/161747 A1 | 11/2012 | |
| WO | WO-2012161747 A1 | 11/2012 | |
| WO | WO-2015004235 A1 | 1/2015 | |

OTHER PUBLICATIONS

Office Action dated Jul. 5, 2021 in TW Application No. 109135295, 8 pages.

European Search Report dated Nov. 25, 2020 in EP Application No. 20179610.9 (8 pages).

* cited by examiner

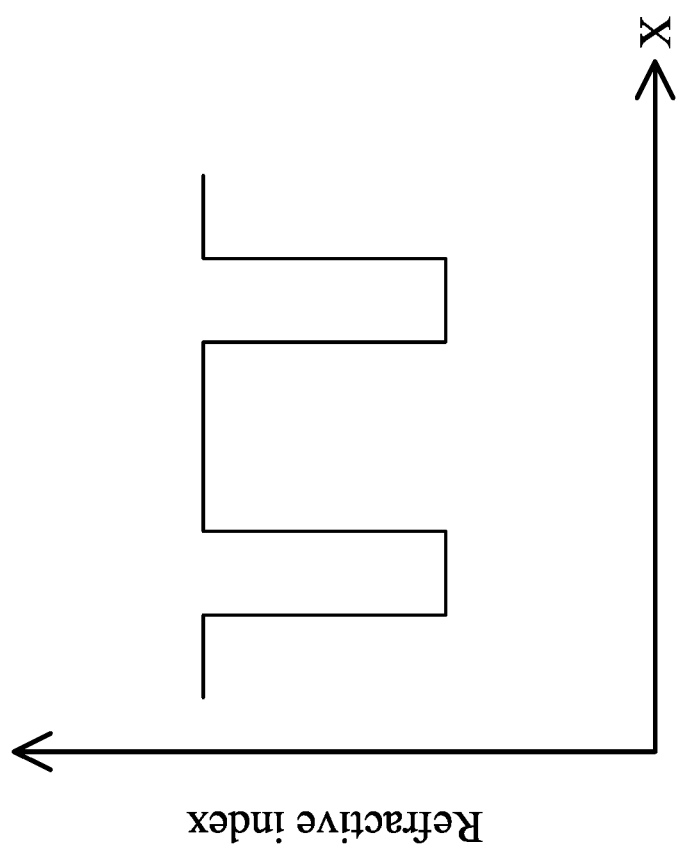

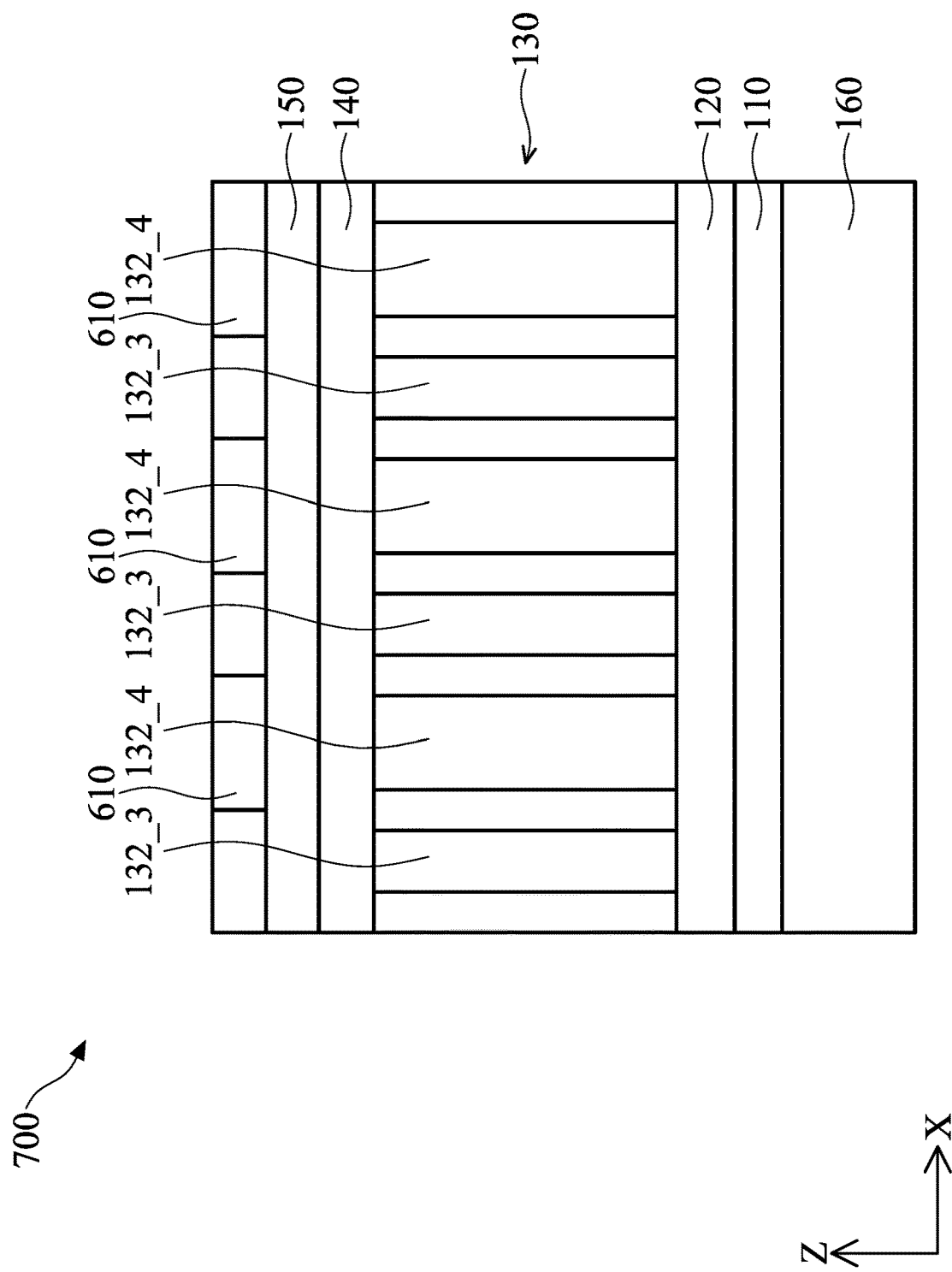

OPTICAL DEVICE

TECHNICAL FIELD

The disclosure relates to an optical device, and in particular it relates to an optical device with high spatial resolution.

BACKGROUND

An optical sensor, such as a spectrometer or an image sensor, is configured to detect light or capture an image of an object. The optical sensor is generally mounted on an electrical device, such as a spectrometer or a camera. Spatial resolution is important for the optical sensor. Therefore, how to effectively increase spatial resolution has become a focus of technical improvements by various manufacturers.

SUMMARY

The disclosure provides an optical device, which includes a first conductive layer, a first junction layer, a light absorption layer, a second junction layer and a second conductive layer. The first junction layer is disposed on the first conductive layer. The light absorption layer is disposed on the first junction layer, wherein the light absorption layer includes a plurality of unit cells, each of the unit cells includes a plurality of pillar structures, and the pillar structures of each of the unit cells are different sizes. The second junction layer is disposed on the light absorption layer. The second conductive layer is disposed on the second junction layer.

BRIEF DESCRIPTION OF DRAWINGS

The disclosure can be more fully understood by reading the subsequent detailed description and examples with references made to the accompanying drawings, wherein:

FIG. 3 is a schematic view of a refractive index of the light absorption layer of the optical device of the according to an embodiment of the disclosure;

FIG. 7B is a cross-sectional view of the optical device in FIG. 7A;

DETAILED DESCRIPTION OF DISCLOSED EMBODIMENTS

Technical terms of the disclosure are based on general definition in the technical field of the disclosure. If the disclosure describes or explains one or some terms, definition of the terms is based on the description or explanation of the disclosure. Each of the disclosed embodiments has one or more technical features. In possible implementation, a person skilled in the art would selectively implement all or some technical features of any embodiment of the disclosure or selectively combine all or some technical features of the embodiments of the disclosure.

In each of the following embodiments, the same reference number represents the same or a similar element or component.

Figure 1:
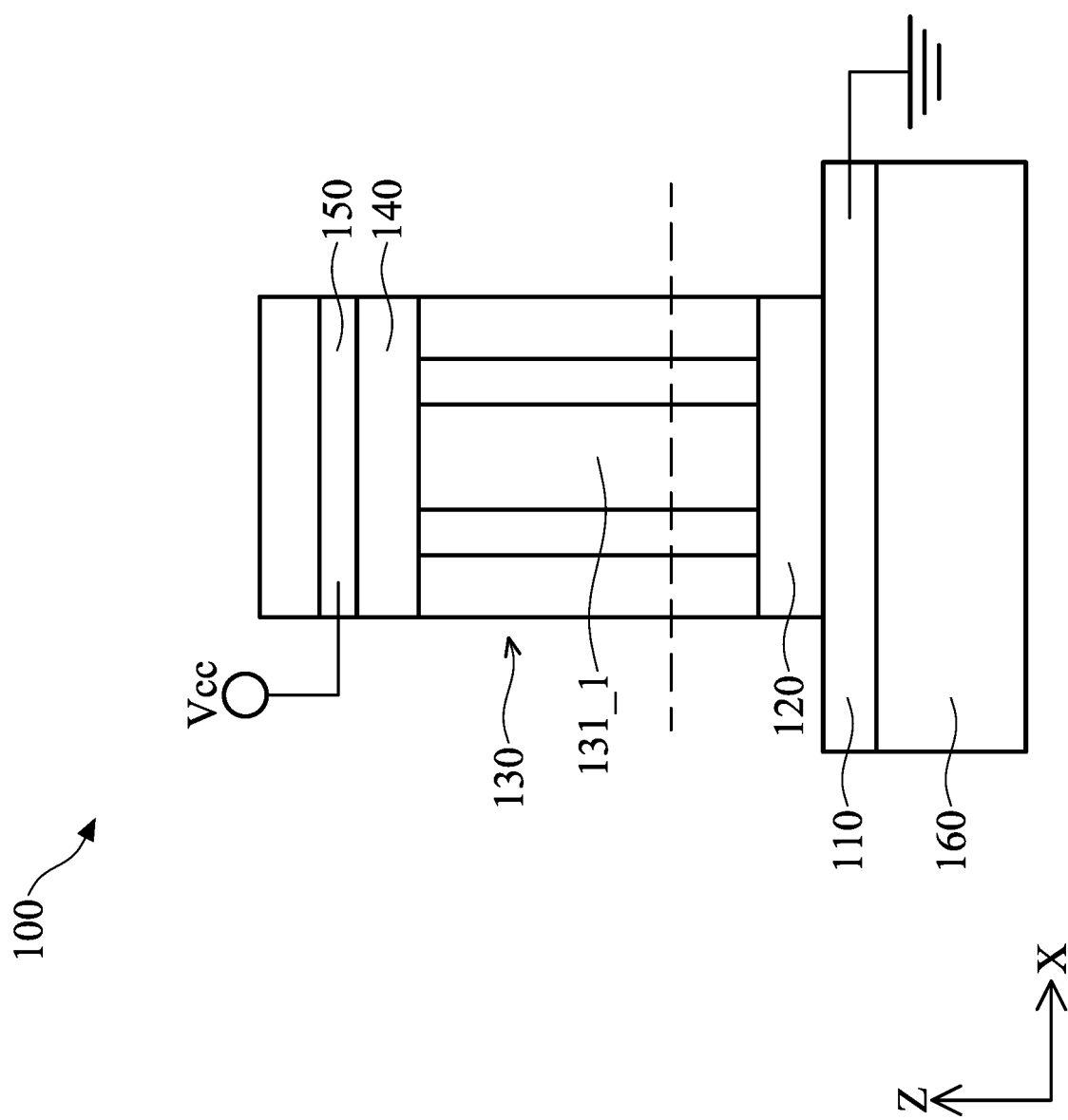
FIG. 1 is a cross-sectional view of an optical device according to an embodiment of the disclosure.
Figure 2:
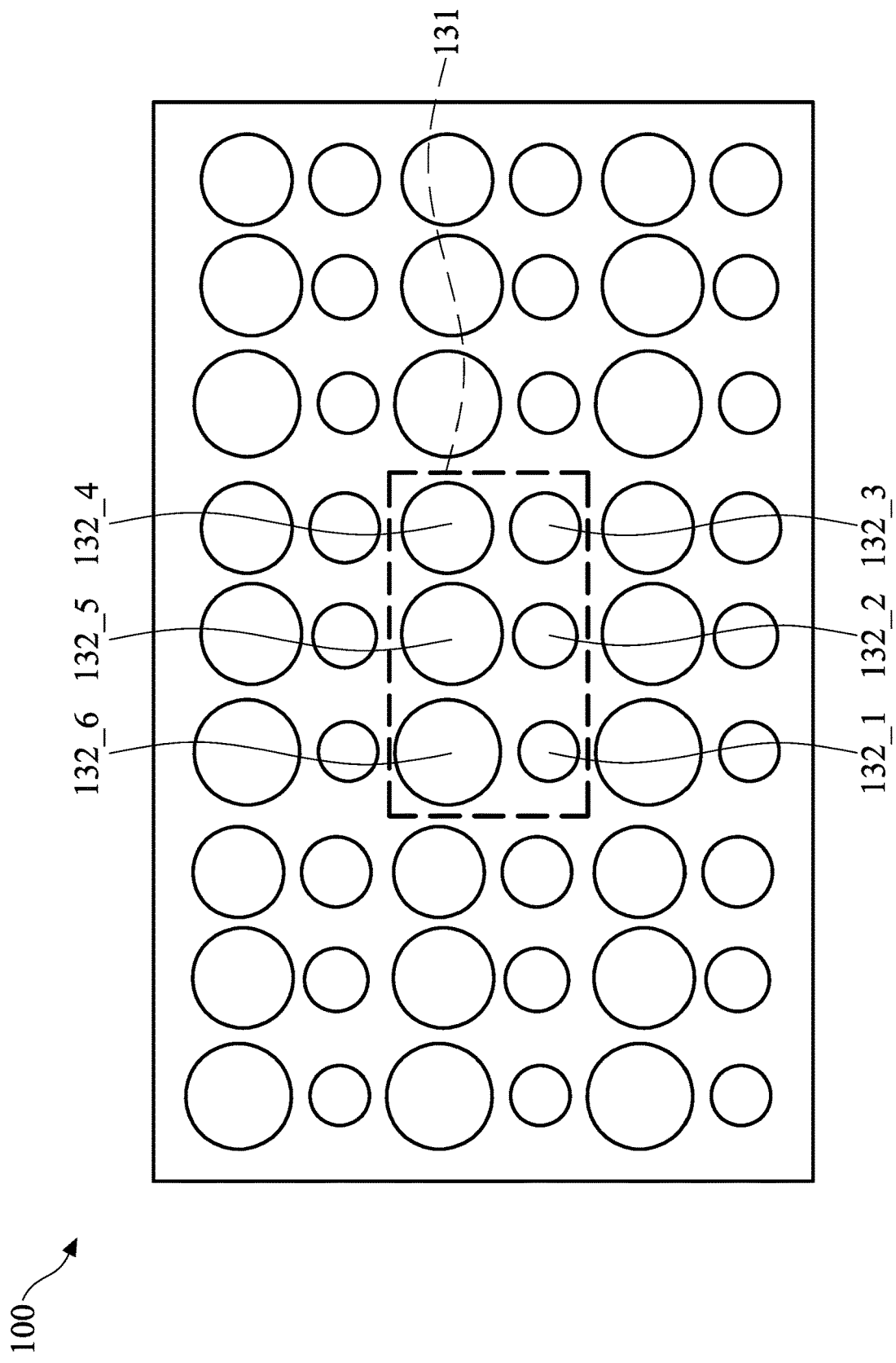
FIG. 2 is a top view of the optical device in FIG. 1.

FIG. 1 is a cross-sectional view of an optical device according to an embodiment of the disclosure. FIG. 2 is a top view of the optical device in FIG. 1. In the embodiment, the optical device 100 is suitable to a CMOS image sensor (CIS), an ambient light sensor (ALS), a spectrometer, etc.

Please refer to FIG. 1 and FIG. 2. The optical device 100 includes a first conductive layer 110, a first junction layer 120 a light absorption layer 130, a second junction layer 140, a second conductive layer 150 and a substrate 160.

In the embodiment, a material of the first conductive layer 120 is an indium tin oxide (ITO), and the first conductive layer 120 is, for example, a contact electrode coupled to a ground. The first junction layer 120 disposed on the first conductive layer 110. In the embodiment, the material of the first junction layer 120 is a p-type amorphous silicon.

The light absorption layer 130 is disposed on the first junction layer 120. The light absorption layer 130 includes a plurality of unit cells 131. Each of the unit cells 131 includes a plurality of pillar structures 132_1, 132_2, 132_3, 132_4, 132_5 and 132_6. In the embodiment, there are at least six pillar structures in each of the unit cells 131, for example. The pillar structures 132_1, 132_2, 132_3, 132_4, 132_5 and 132_6 of each of the unit cells 131 are different sizes. For example, the sizes of the pillar structures 132_1, 132_2, 132_3, 132_4, 132_5 and 132_6 are increase in series.

For example, the size of the pillar structure 132_1 is less than the size of the pillar structure 132_2. The size of the pillar structure 132_2 is less than the size of the pillar structure 132_3. The size of the pillar structure 132_3 is less than the size of the pillar structure 132_4. The size of the pillar structure 132_4 is less than the size of the pillar structure 132_5. The size of the pillar structure 132_5 is less than the size of the pillar structure 132_6.

In the embodiment, materials of the pillar structures 132_1, 132_2, 132_3, 132_4, 132_5 and 132_6 are an amorphous silicon (a-Si) and amorphous silicon impurities. Therefore, the corresponding refractive index of each of the unit cells 131 is shown in FIG. 3. In FIG. 3, the refractive index of each of the unit cells 131 exhibits, for example, a W-shaped change.

The second junction layer 140 is disposed on the light absorption layer 130. In the embodiment, the material of the second junction layer 140 is an n-type amorphous silicon. The second conductive layer 150 is disposed on the second junction layer 140. In the embodiment, a material of the second conductive layer 150 is the indium tin oxide (ITO), and the second conductive layer 150 is, for example, a contact electrode coupled to a voltage terminal VCC). The substrate 160 is disposed on a side of the first conductive layer 110 opposite the first junction layer 120. In the embodiment, a material of the substrate 160 is, for example, a glass. The optical device 100 transforms the confinement mode wave into an electric current through the first junction layer 120, the light absorption layer 130, and the second junction layer 140, and outputs the electric current through the first conductive layer 110 and the second conductive layer 150.

Figure 4A:
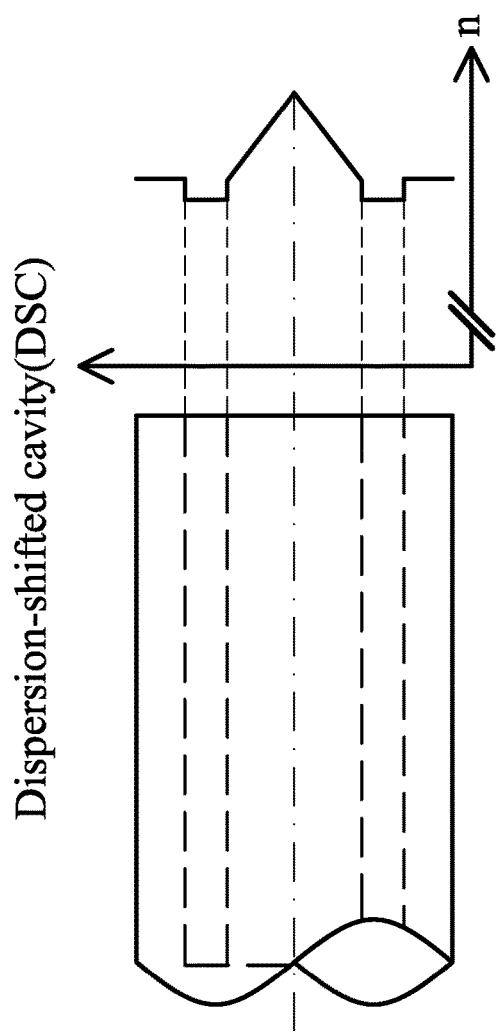
FIG. 4A is a schematic view of a corresponding relationship of a dispersion shifted cavity and the refractive index thereof according to an embodiment of the disclosure.
Figure 4B:
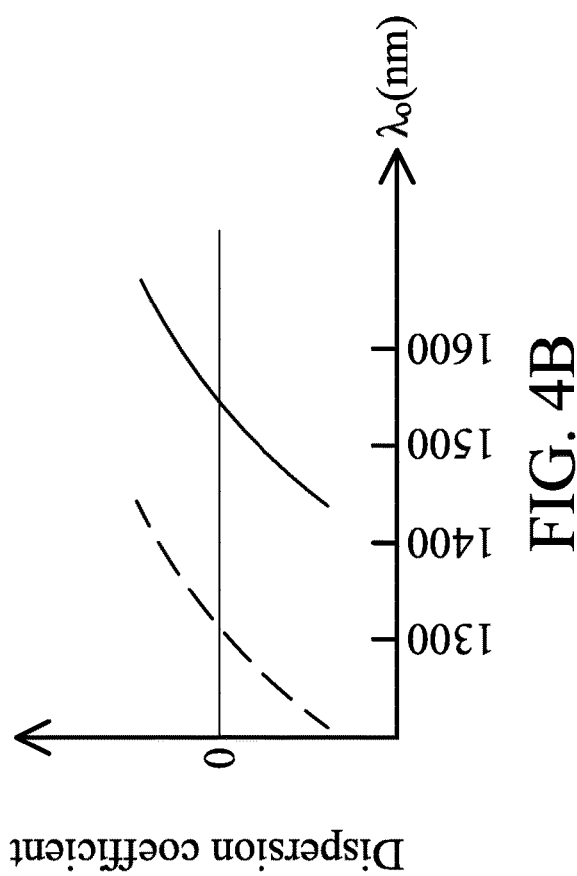
FIG. 4B is a schematic view of the dispersion in FIG. 4A.

FIG. 4A is a schematic view of a corresponding relationship of a dispersion-shifted cavity and the refractive index thereof according to an embodiment of the disclosure. FIG. 4B is a schematic view of the dispersion in FIG. 4A. In general, the light may be decayed in a light propagation due to the dispersion in the waveguide cavity. In order to solve the dispersion in the waveguide cavity, the different refractive indexes in the waveguide cavity may be used, such as a dispersion-shifted cavity (DSC), as shown in FIG. 4A. By the dispersion-shifted cavity, the dispersion may be shifted from the original wavelength (such as the dotted line) to another wavelength (such as the solid line), as shown in FIG. 4. Therefore, the dispersion of the original wavelength may be close to 0.

Figure 4C:
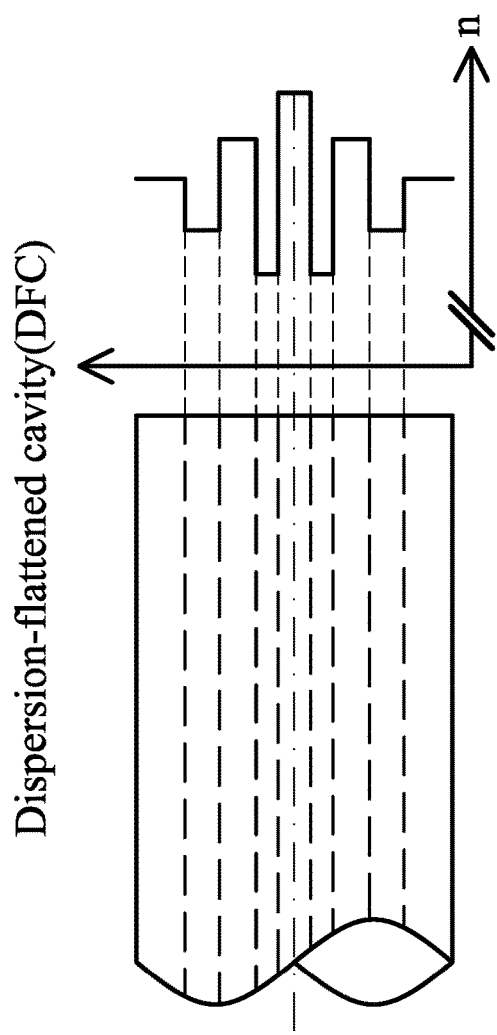
FIG. 4C is a schematic view of a corresponding relationship of a dispersion-flattened cavity and the refractive index thereof according to an embodiment of the disclosure.
Figure 4D:
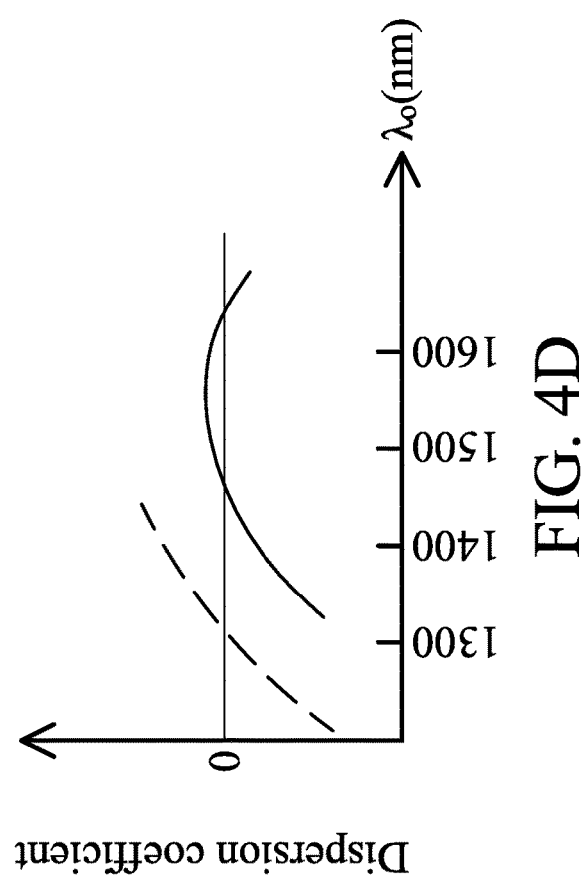
FIG. 4D is a schematic view of the dispersion in FIG. 4C.

FIG. 4C is a schematic view of a corresponding relationship of a dispersion-flattened cavity and the refractive index thereof according to an embodiment of the disclosure. FIG. 4D is a schematic view of the dispersion in FIG. 4C. In order to solve the dispersion in the waveguide cavity, the different refractive indexes in the waveguide cavity may be used, such as a dispersion-flattened cavity (DFC), as shown in FIG. 4C. By the dispersion-shifted cavity, the dispersion may be flattened (such as the dotted line), as shown in FIG. 4D. Therefore, the dispersion may be effectively inhibited, i.e., there is almost no dispersion in a certain wavelength, so that the light propagated in the waveguide cavity may be not decayed.

In the embodiment, the unit cells 131 of the optical device 100 uses the concepts of FIGS. 4A-4D. Therefore, the optical device 100 may be effectively inhibit the dispersion of the light propagation.

Figure 5B:
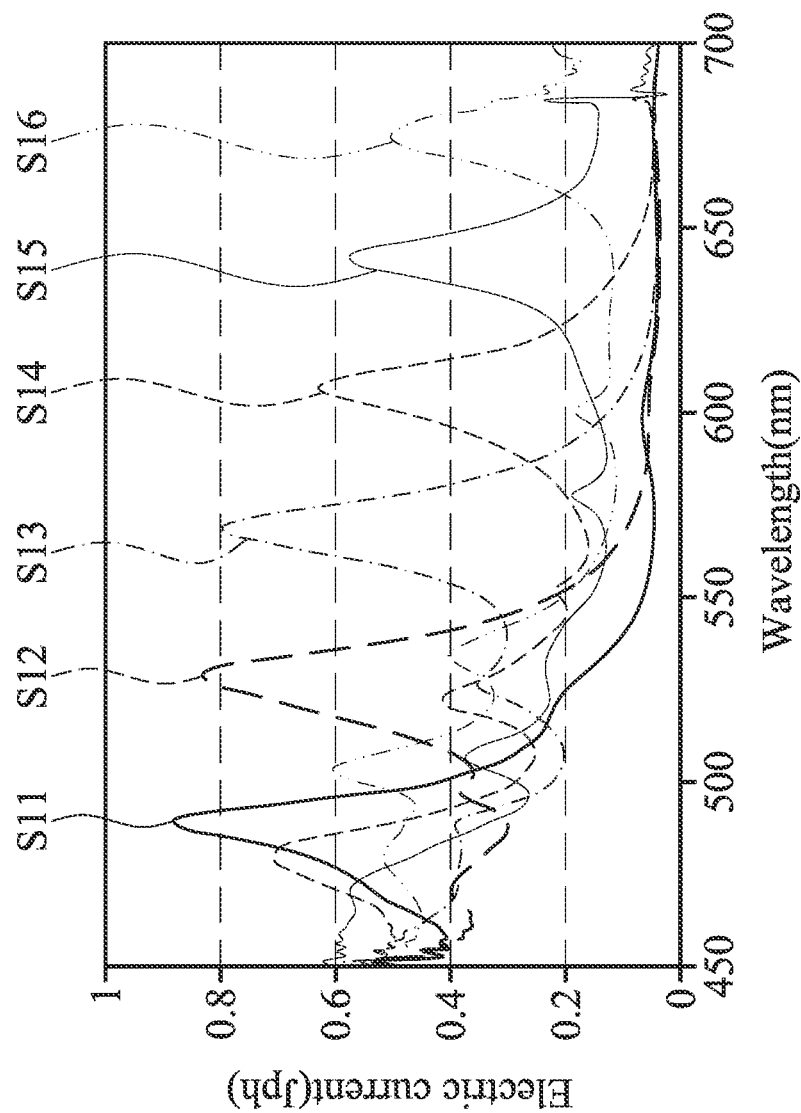
FIG. 5B is a waveform diagram of transforming the light absorbed by the light absorption layer into an electronic current according to an embodiment of the disclosure.
Figure 5A:
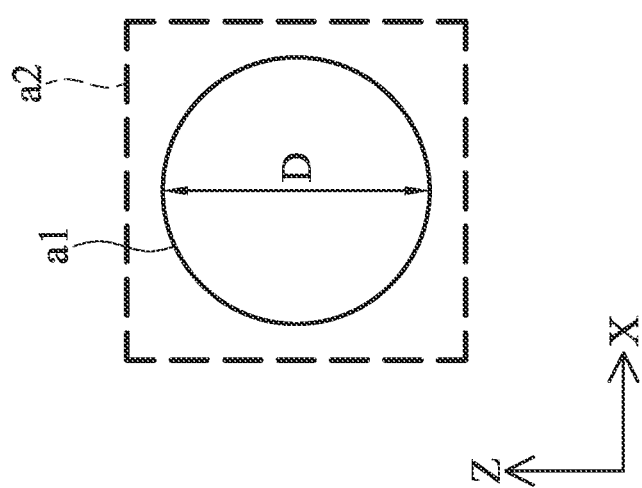
FIG. 5A is a schematic view of a size of the pillar structure according to an embodiment of the disclosure.

FIG. 5A is a schematic view of a size of the pillar structure according to an embodiment of the disclosure. In FIG. 5A, a1 indicates a size of the pillar structure, a2 indicates a maximum setting range of the pillar structure, and D is the width of the size of the pillar structure. In the embodiment, the width of the size of each of the pillar structure is less than 0.5 um.

A ratio of a1 and a2 (a1/a2) may determine a wavelength of the light absorbed by the pillar structure. For example, when the ratio of a1 and a2 (a1/a2) is small, the wavelength of the light absorbed by the pillar structure may be small. When the ratio of a1 and a2 (a1/a2) is large, the wavelength of the light absorbed by the pillar structure may be large. Therefore, the pillar structure may absorb the light to generate the largest electric current in the corresponding wavelength of the light. For example, the ratio of a1 and a2 (a1/a2) is 46%, the pillar structure may absorb the light to generate the largest electric current in the corresponding wavelength (such as close to 550 nm) of the light.

The electric current transformed by the pillar structure may be calculated by the following equation (1).

$$J_{ph} = q*N_{ph} \sim q*(P_2 - P_1), \quad (1)$$

wherein $J_{ph}$ indicates a photon current density, q indicates an electric charge, $N_{ph}$ indicates the number of an induced charge by an incident photon, $P_2$ indicates an incident optical power on the top-surface of the pillar structure, $P_1$ indicates the optical power of the bottom-surface of the pillar structure and $(P_2-P_1)$ indicates an existing light power within the pillar structure.

In the embodiment, the wavelength of the light absorbed by each of the pillar structures changes as the size of the pillar structure changes. Furthermore, when the size of the pillar structure is large, the wavelength of the light absorbed by the pillar structure is large, and when the size of the pillar structure is small, the wavelength of the light absorbed by the pillar structure is small.

For example, the wavelength of the light absorbed by the pillar structure 132_1 is shorter than the wavelength of the light absorbed by the pillar structure 132_2. The wavelength of the light absorbed by the pillar structure 132_2 is shorter than the wavelength of the light absorbed by the pillar structure 132_3. The wavelength of the light absorbed by the pillar structure 132_3 is shorter than the wavelength of the light absorbed by the pillar structure 132_4. The wavelength of the light absorbed by the pillar structure 132_4 is shorter than the wavelength of the light absorbed by the pillar structure 132_5. The wavelength of the light absorbed by the pillar structure 132_5 is shorter than the wavelength of the light absorbed by the pillar structure 132_6.

FIG. 5B is a waveform diagram of transforming the light absorbed by the light absorption layer into an electronic current according to an embodiment of the disclosure. In the embodiment, the wavelength range of the light absorbed by the light absorption layer 130 is, for example, 450-700 nm. In FIG. 5B, curve S11 corresponds to the pillar structure 132_1, curve S12 corresponds to the pillar structure 132_2, curve S13 corresponds to the pillar structure 132_3, curve S14 corresponds to the pillar structure 132_4, curve S15 corresponds to the pillar structure 132_5 and curve S16 corresponds to the pillar structure 132_6.

The pillar structure 132_1 may absorb light to generate the largest electric current in the corresponding wavelength of the light of the curve S11. The pillar structure 132_2 may absorb the light to generate the largest electric current in the corresponding wavelength of the light of the curve S12. The pillar structure 132_3 may absorb the light to generate the largest electric current in the corresponding wavelength of the light of the curve S13.

The pillar structure 132_4 may absorb the light to generate the largest electric current in the corresponding wavelength of the light of the curve S14. The pillar structure 132_5 may absorb the light to generate the largest electric current in the corresponding wavelength of the light of the curve S15. The pillar structure 132_6 may absorb the light to generate the largest electric current in the corresponding wavelength of the light of the curve S16.

Figure 6A:
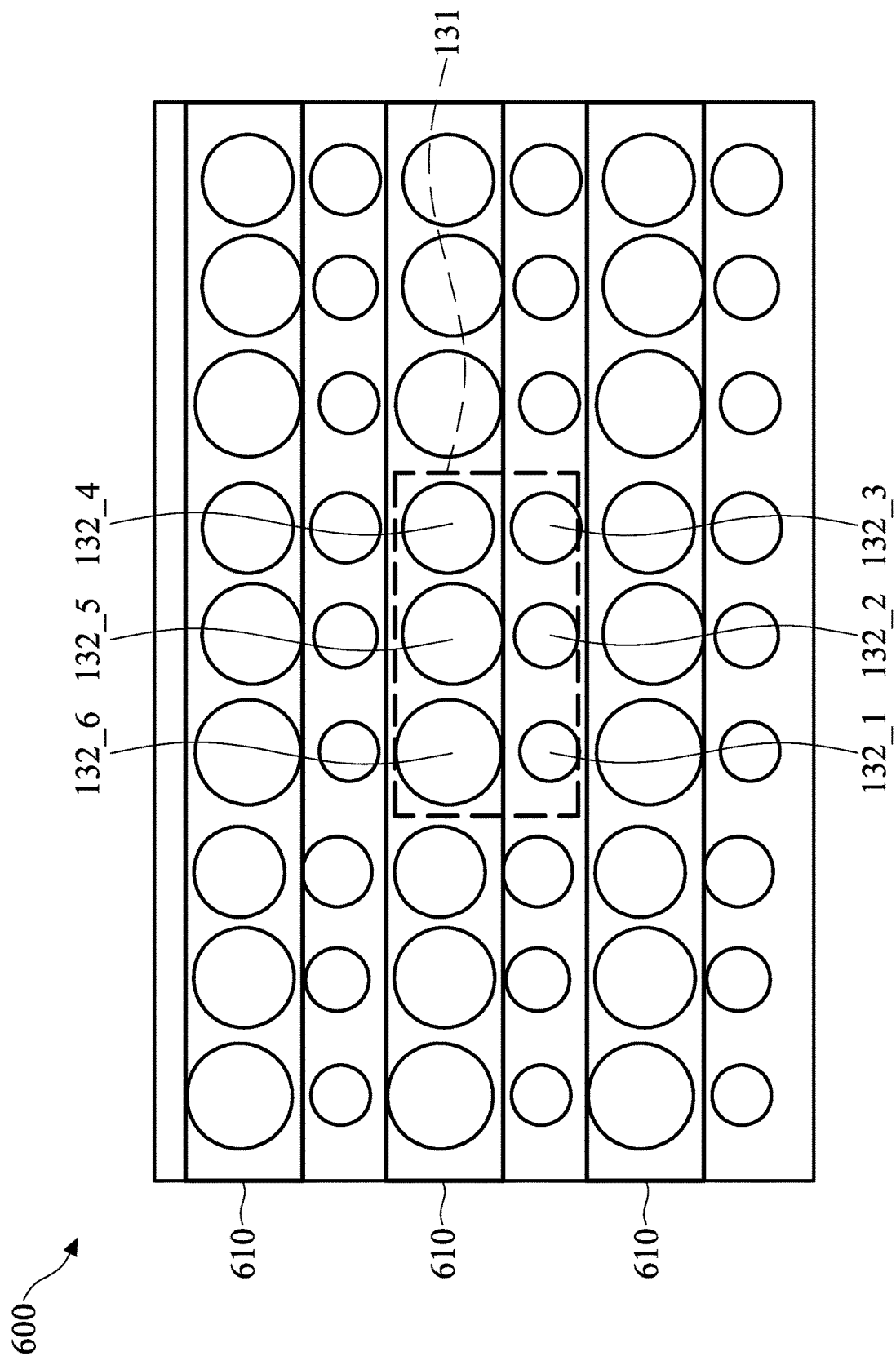
FIG. 6A is a top view of an optical device according to another embodiment of the disclosure.
Figure 6B:
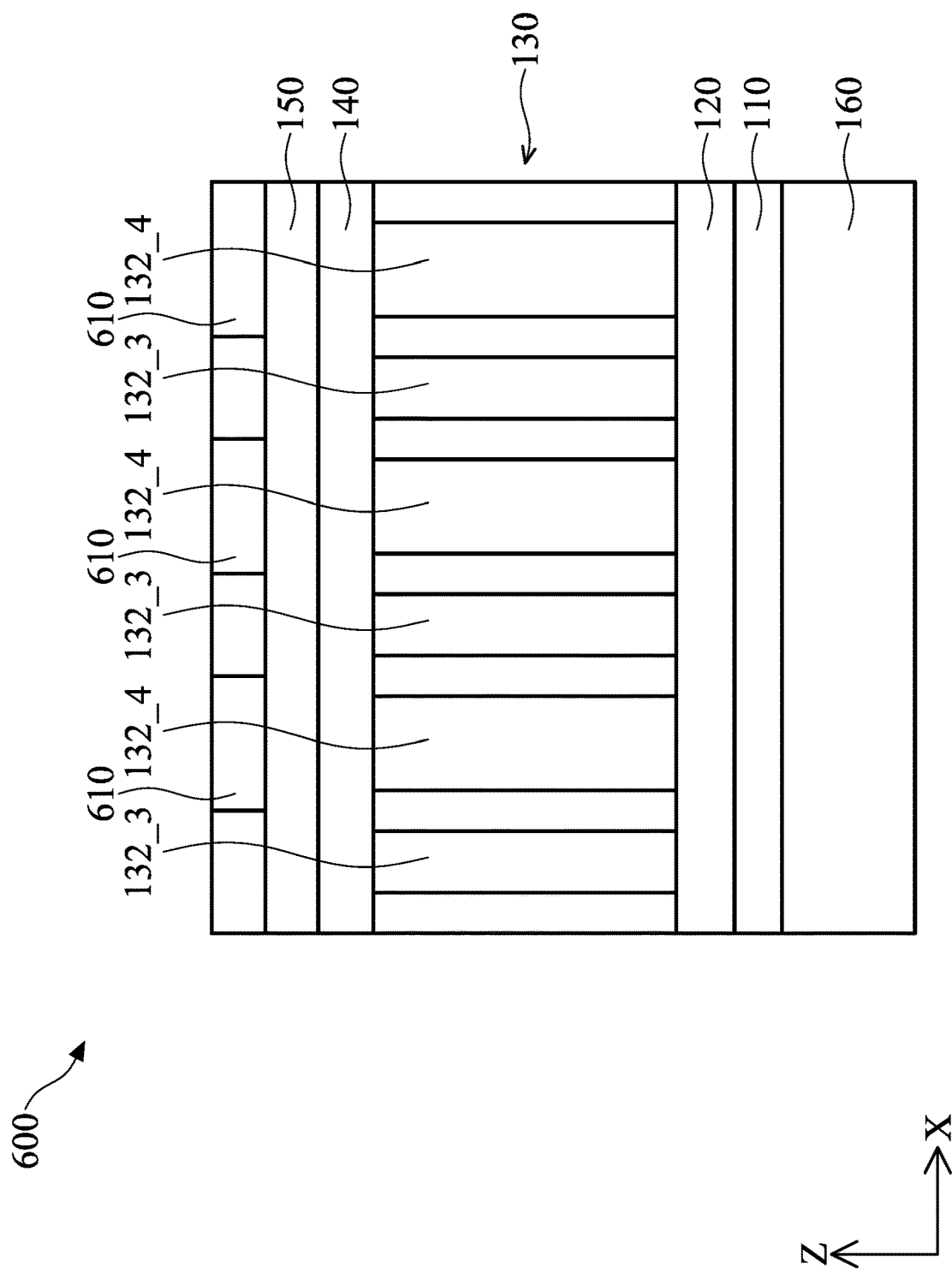
FIG. 6B is a cross-sectional view of the optical device in FIG. 6.

FIG. 6A is a top view of an optical device according to another embodiment of the disclosure. FIG. 6B is a cross-sectional view of the optical device in FIG. 6A. Please refer to FIG. 6A and FIG. 6B, the optical device 600 is similar to the optical device 100. That is, the optical device 600 includes the first conductive layer 110, a first junction layer 120, a light absorption layer 130, a second junction layer 140 a second conductive layer 150 and a substrate 160 in FIG. 1, and the optical device 600 further includes a plurality of filter layers 610.

Each of the filter layers 610 is disposed on parts of the pillar structures of each of the unit cells 131. For example, the filter layer 610 is disposed on the pillar structure 132_4, the pillar structure 132_5 and the pillar structure 132_6 of each of the unit cells 131.

In the embodiment, the parts of the pillar structures (such as the pillar structure 132_4, the pillar structure 132_5 and the pillar structure 132_6) of each of the unit cells 131 have side bands less than a predetermined wavelength in a wavelength range of the light absorbed by the light absorption layer 130. In the embodiment, each of the filter layers 610 may include, for example, a multi-film. By the filter layers 610, the side bands of the pillar structure 132_4, the pillar structure 132_5 and the pillar structure 132_6 may be effectively inhibited, so as to increase the accuracy of the optical device 600.

Figure 7A:
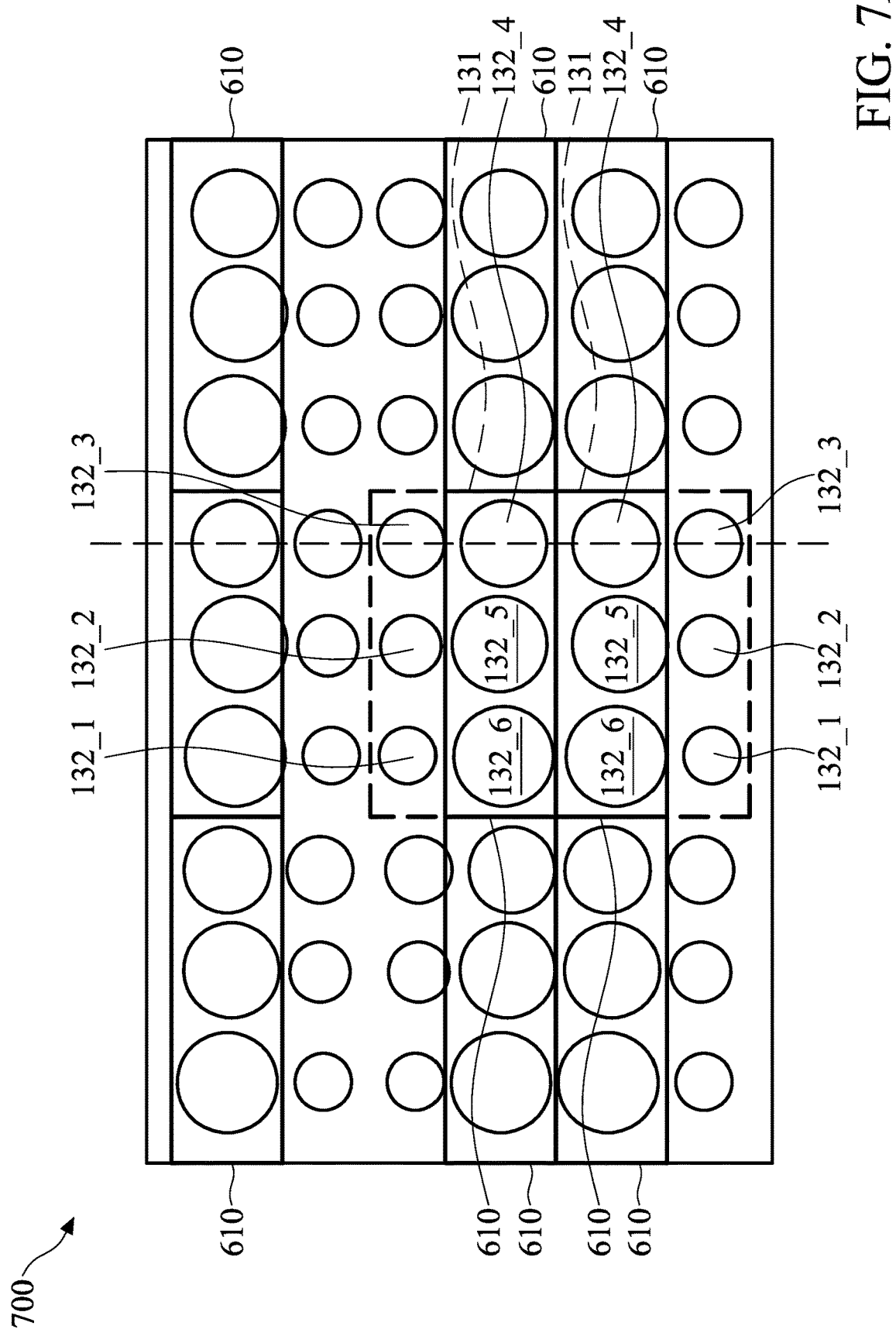
FIG. 7A is a top view of an optical device according to another embodiment of the disclosure.

FIG. 7A is a top view of an optical device according to another embodiment of the disclosure. FIG. 7B is a cross-sectional view of the optical device in FIG. 7A. Please refer to FIG. 7A and FIG. 7B, the optical device 700 is similar to the optical device 600. The difference between the optical device 700 and the optical device 600 is the arrangement of the pillar structures. That is, in the optical device 700, the parts of the pillar structures of every two unit cells are arranged adjacent to each other. For example, the pillar structure 132_4, the pillar structure 132_5 and the pillar structure 132_6 of every two unit cells 131 are arranged adjacent to each other.

The optical device 700 also includes a plurality of filter layers 610. Each of the filter layers 610 is disposed on parts of the pillar structures of each of the unit cells 131. For example, the filter layer 610 is disposed on the pillar structure 1324, the pillar structure 132_5 and the pillar structure 132_6 of each of the unit cells 131. In the embodiment, the parts of the pillar structures (such as the pillar structure 132_4, the pillar structure 132_5 and the pillar structure 1326) of each of the unit cells 131 have side bands less than a predetermined wavelength in a wavelength range of the light absorbed by the light absorption layer 130. In the embodiment, each of the filter layers 610 may include, for example, a multi-film. The optical device 700 may achieve the same effect of the optical device 600. In addition, the process of forming the filter layers 610 may be simplified by the arrangement of the pillar structures of the optical device 700.

Figure 8:
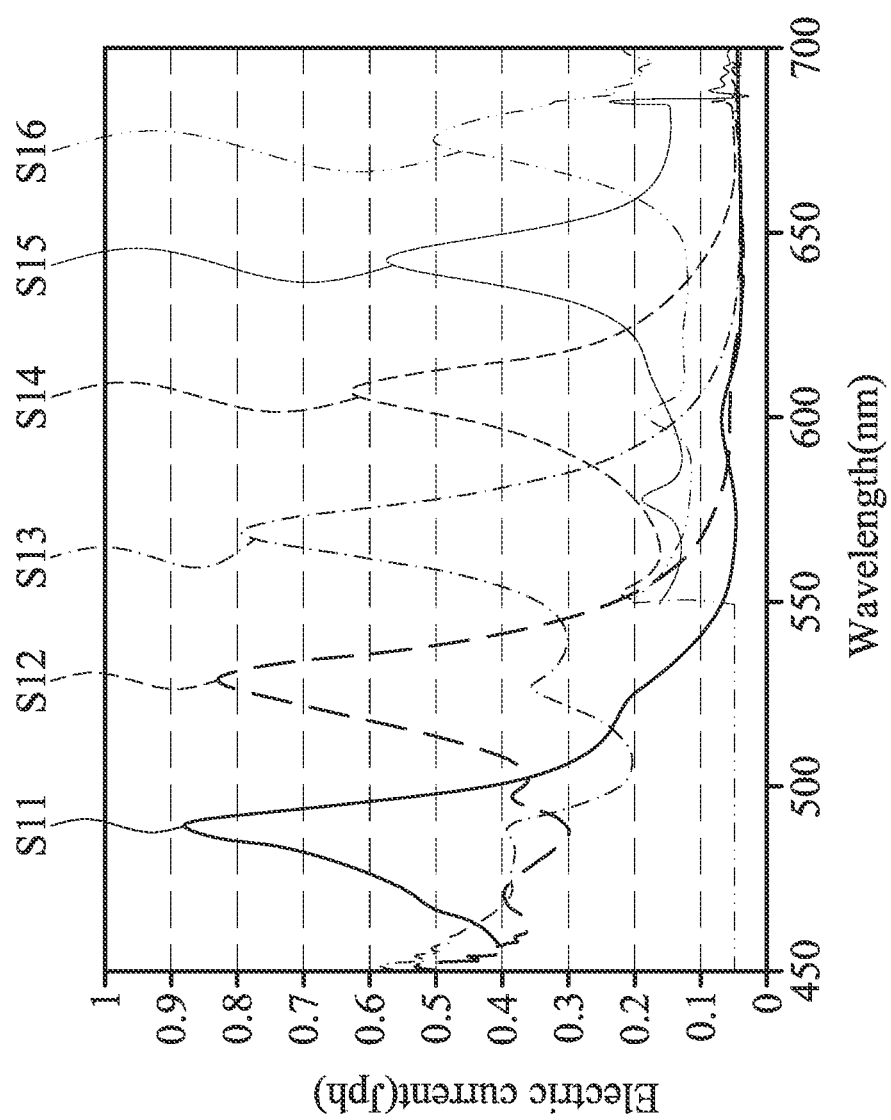
FIG. 8 is a waveform diagram of transforming the light absorbed by the light absorption layer into an electronic current according to another embodiment of the disclosure.

FIG. 8 is a waveform diagram of transforming the light absorbed by the light absorption layer into an electronic current according to another embodiment of the disclosure. In the embodiment, a wavelength range of the light absorbed by the light absorption layer 130 is, for example, 450-700 nm, and the predetermined wavelength is 550 nm.

In FIG. 8, a curve S11 corresponds to the pillar structure 132_1, a curve S12 corresponds to the pillar structure 132_2, a curve S13 corresponds to the pillar structure 132_3, a curve S14 corresponds to the pillar structure 132_4, a curve S15 corresponds to the pillar structure 132_5 and a curve S16 corresponds to the pillar structure 132_6.

Compared to FIG. 5B, it can be seen from the curves S14', S15' and S16' of FIG. 8, the side bands of the pillar structure 132_4, the pillar structure 132_5 and the pillar structure 132_6 of the unit cell 131 may be effectively inhibited. Therefore, the accuracy of the optical device (such as the optical device 600 or the optical device 700) may be increased.

Figure 9A:
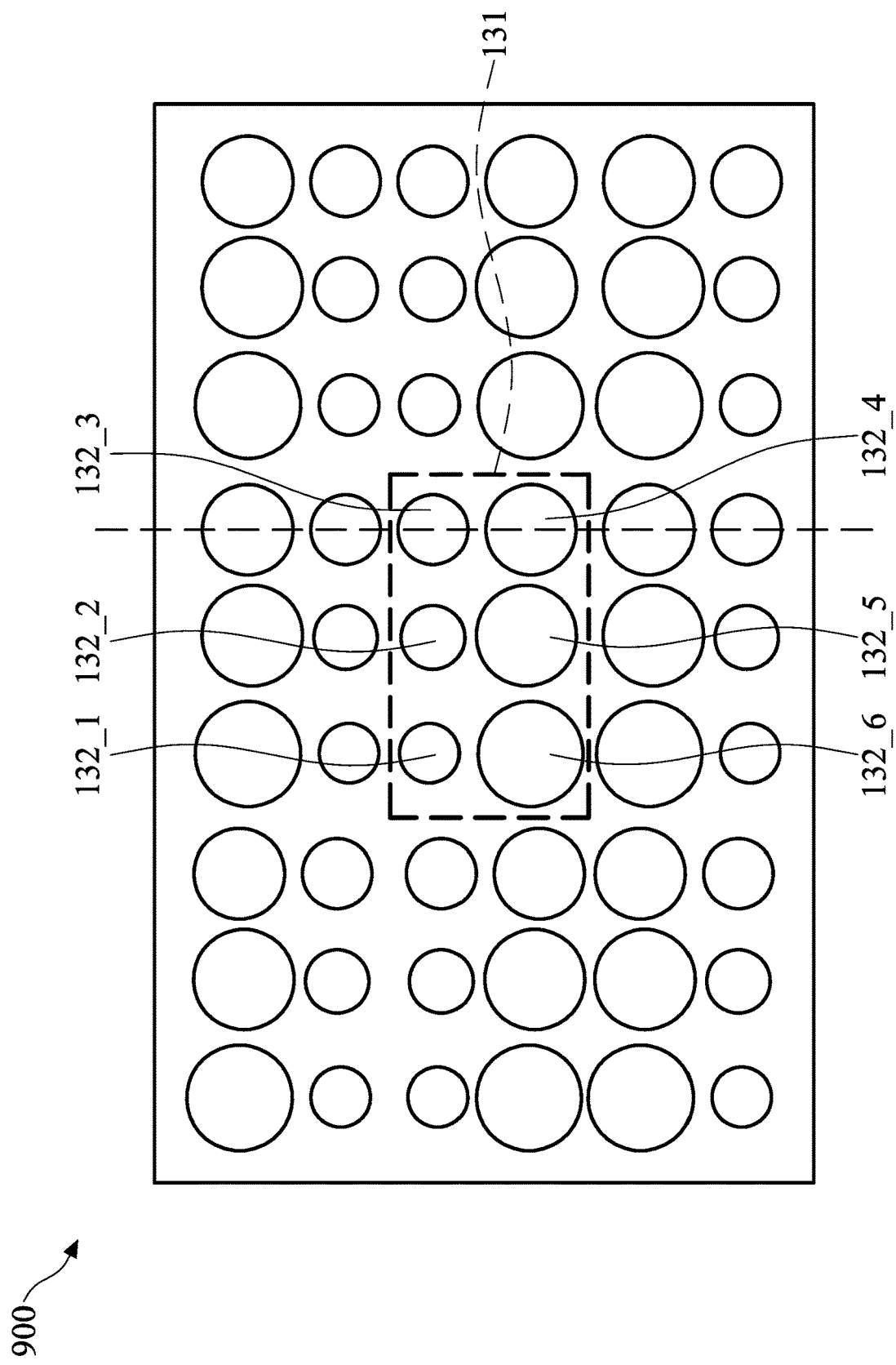
FIG. 9A is a top view of an optical device according to another embodiment of the disclosure.
Figure 9B:
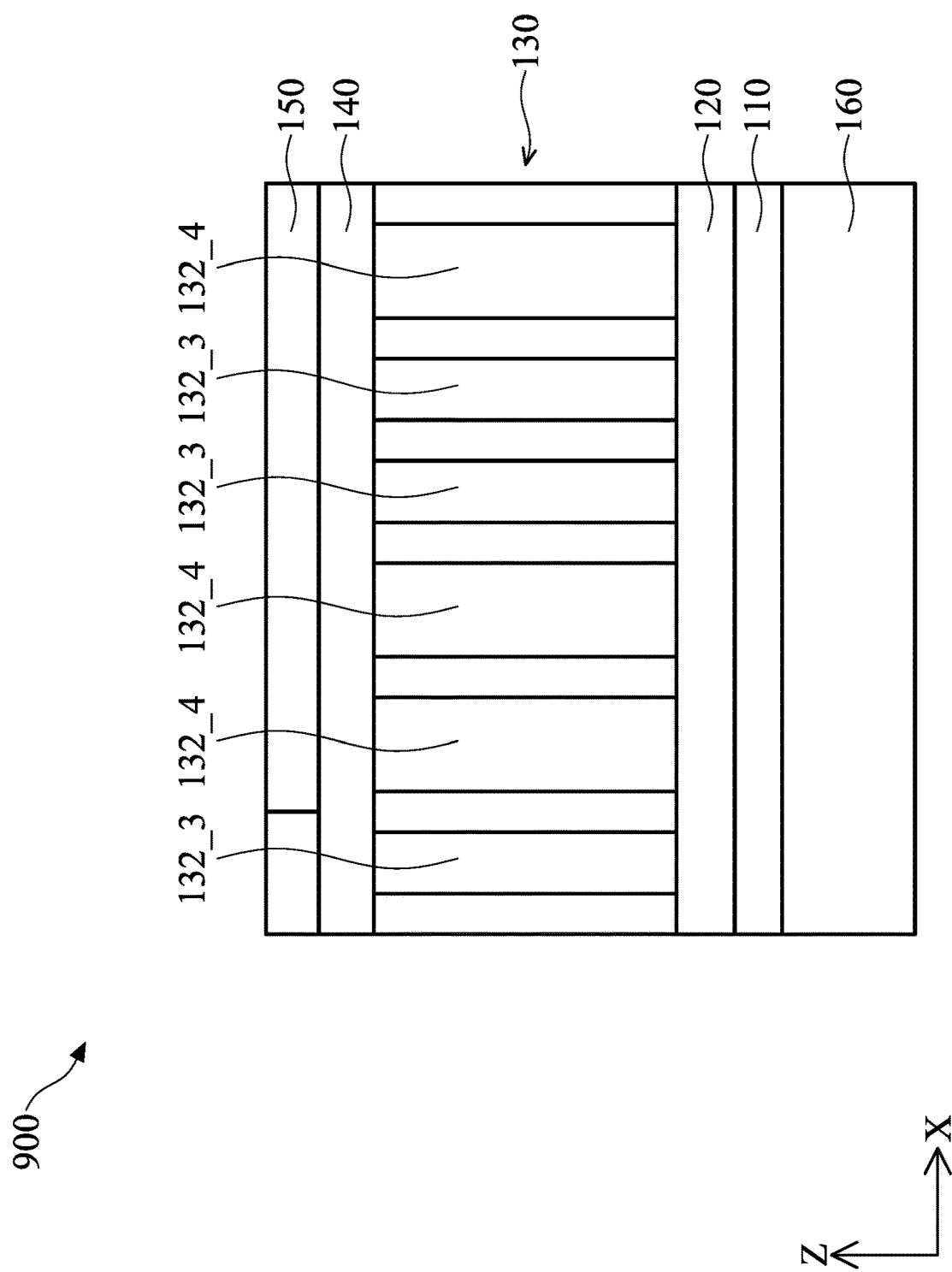
FIG. 9B is a cross-sectional view of the optical device in FIG. 9A.

FIG. 9A is a top view of an optical device according to another embodiment of the disclosure. FIG. 9B is a cross-sectional view of the optical device in FIG. 9A. Please refer to FIG. 9A and FIG. 9B, the optical device 900 is similar to the optical device 700. The difference between the optical device 900 and the optical device 700 is that the optical device 900 does not include the filter layers 610.

In the embodiment, materials of parts of the pillar structures of each of the unit cells are an amorphous silicon and amorphous silicon impurities, and the other parts of the pillar structures of each of unit cells are a germanium (Ge) and germanium impurities, wherein the other parts of the pillar structures of each of the unit cells have side bands less than a predetermined wavelength in a wavelength range of a light absorbed by the light absorption layer. In addition, the wavelength range of the light absorbed by the light absorption layer is 450-700 nm, and the predetermined wavelength is 550 nm.

For example, in the embodiment, the materials of the pillar structure 132_1, the pillar structure 132_2 and the pillar structure 132_3 of the unit cell 131 are the amorphous silicon and the amorphous silicon impurities. The materials of the pillar structure 1324, the pillar structure 132_5, and the pillar structure 132_6 of the unit cell 131 are the germanium (Ge) and the germanium impurities. Therefore, the side bands of the pillar structure 132_4, the pillar structure 132_5, and the pillar structure 132_6 of the unit cell 131 may also be effectively inhibited, as shown in the curves S14', S15' and S16' of FIG. 8.

In the embodiments above, the unit cell 131 includes six pillar structures 131_1, 131_2, 131_3, 131_4, 131_5 and 131_6, but the embodiment of the disclosure is not limited thereto. The user may adjust the number of pillar structures of each of the unit cells to suit the embodiment. For example, there may be at least six pillar structures. Another embodiment is described as follows.

Figure 10A:
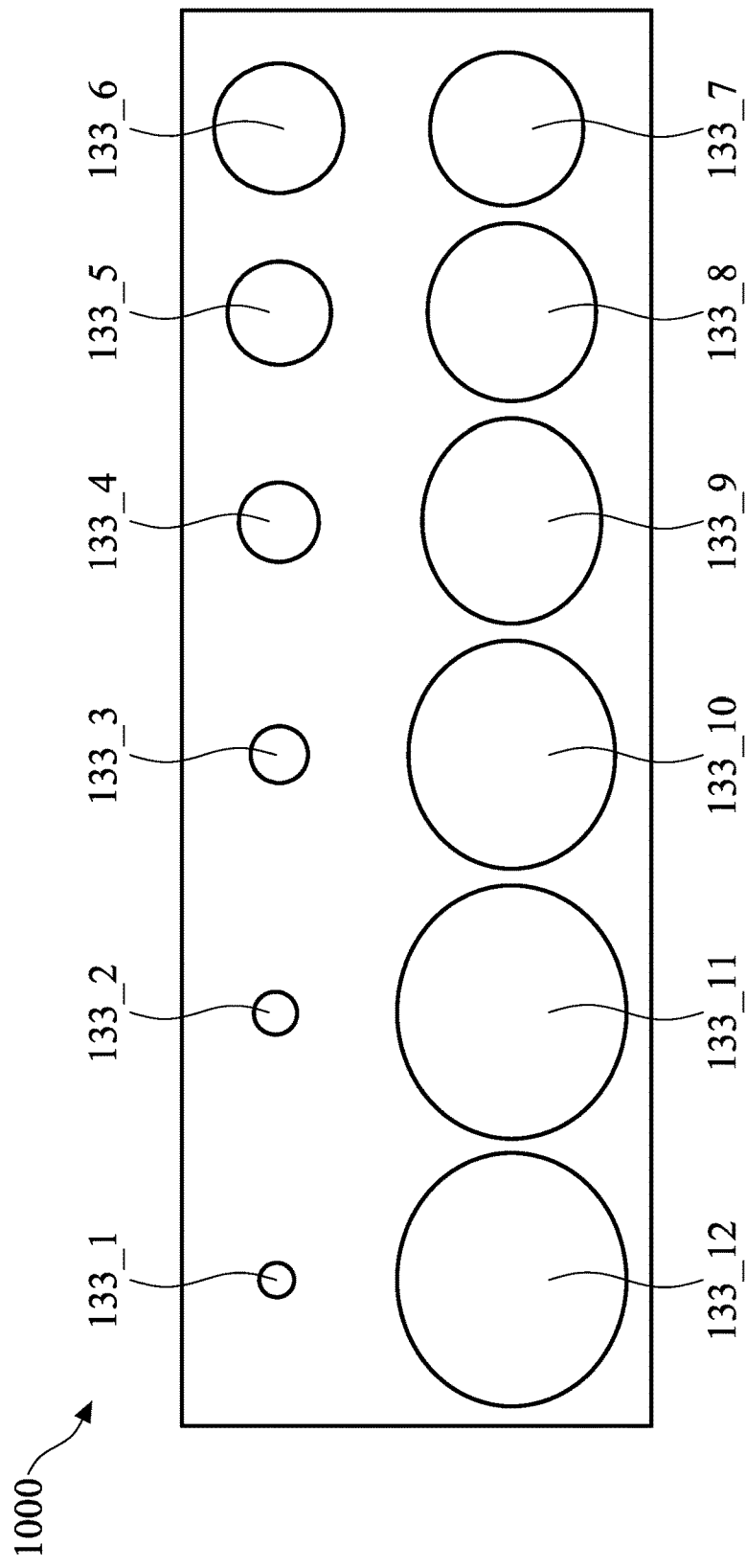
FIG. 10A is a top view of an optical device according to another embodiment of the disclosure.

FIG. 10A is a top view of an optical device according to another embodiment of the disclosure. Please refer to FIG. 10A, the optical device 1000 is similar to the optical device 100. The difference between optical device 1000 and optical device 100 is the number of pillar structures. In the optical device 1000, each of the cells 131 includes twelve pillar structures 133_1, 133_2, 133_3, 133_4, 133_5, 1336, 133_7, 133_8, 133_9, 133_10, 133_11 and 133_12. The pillar structures 133_1, 133_2, 133_3, 133_4, 133_5, 133_6, 133_7, 133_8, 133_9, 133_10, 133_11 and 133_12 of the unit cells 131 are different sizes.

The pillar structures 133_1, 133_2, 133_3, 133_4, 133_5, 133_6, 133_7, 133_8, 133_9, 133_10, 133_11 and 133_12 of optical device 1000 are similar to the pillar structures 132_1, 132_2, 132_3, 132_4, 132_5 and 132_6 of optical device 100. The description is similar to the embodiment of the pillar structures 132_1, 132_2, 132_3, 132_4, 132_5 and 132_6 of the optical device 100, so the description thereof is not repeated herein.

Figure 10B:
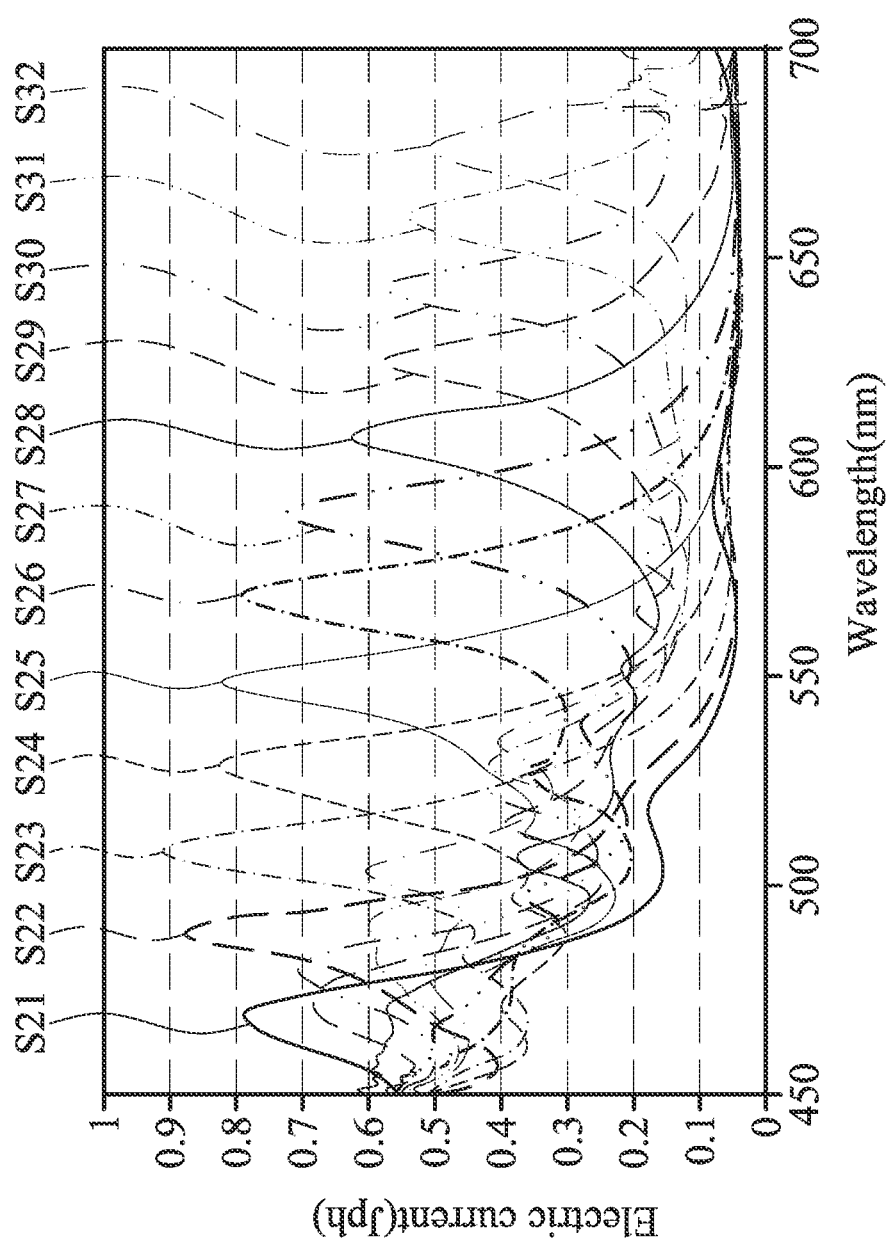
FIG. 10B is a waveform diagram of transforming the light absorbed by the light absorption layer into an electronic current according to an embodiment of the disclosure.

FIG. 10B is a waveform diagram of transforming the light absorbed by the light absorption layer into an electronic current according to an embodiment of the disclosure. In the embodiment, a wavelength range of the light absorbed by the light absorption layer 130 is, for example, 450-700 nm. In FIG. 5B, a curve S21 corresponds to the pillar structure 133_1, a curve S22 corresponds to the pillar structure 133_2, a curve S23 corresponds to the pillar structure 133_3, a curve S24 corresponds to the pillar structure 1334, a curve S25 corresponds to the pillar structure 133_5, a curve S26 corresponds to the pillar structure 133_6, a curve S27 corresponds to the pillar structure 133_7, a curve S28 corresponds to the pillar structure 133_8, a curve S29 corresponds to the pillar structure 133_9, a curve S30 corresponds to the pillar structure 133_10, a curve S31 corresponds to the pillar structure 133_11, a curve S32 corresponds to the pillar structure 133_12.

The pillar structure 133_1 may absorb the light to generate the largest electric current in the corresponding wavelength of the light of the curve S21. The pillar structure 133_2 may absorb the light to generate the largest electric current in the corresponding wavelength of the light of the curve S22. The pillar structure 133_3 may absorb the light to generate the largest electric current in the corresponding wavelength of the light of the curve S23.

The pillar structure 133_4 may absorb the light to generate the largest electric current in the corresponding wavelength of the light of the curve S24. The pillar structure 133_5 may absorb the light to generate the largest electric current in the corresponding wavelength of the light of the curve S25. The pillar structure 133_6 may absorb the light to generate the largest electric current in the corresponding wavelength of the light of the curve S26.

The pillar structure 133_7 may absorb the light to generate the largest electric current in the corresponding wavelength of the light of the curve S27. The pillar structure 133_8 may absorb the light to generate the largest electric current in the corresponding wavelength of the light of the curve S28. The pillar structure 139_3 may absorb the light to generate the largest electric current in the corresponding wavelength of the light of the curve S29.

The pillar structure 133_10 may absorb the light to generate the largest electric current in the corresponding wavelength of the light of the curve S30. The pillar structure 133_11 may absorb the light to generate the largest electric current in the corresponding wavelength of the light of the curve S31. The pillar structure 133_12 may absorb the light to generate the largest electric current in the corresponding wavelength of the light of the curve S32.

In addition, the optical device 1000 may also include filter layers 610 similar to FIGS. 6A and 6B, so as to inhibit the side bands of the corresponding pillar structures. The setting manner of filter layers 610 of the optical device 1000 may refer to the embodiment of FIGS. 6A and 6B, and the description thereof is not repeated herein. Furthermore, the optical device 1000 may implant the different materials in the pillar structures, so as to inhibit the side bands of the corresponding pillar structures. The manner of implanting the different materials may refer to the embodiments of FIGS. 9A and 9B, and the description thereof is not repeated herein.

In summary, according to the optical device disclosed by the disclosure, the light absorption layer includes the unit cells, each of the unit cells includes the pillar structures, and the pillar structures of each of the unit cells are different sizes. Therefore, the high spatial resolution may be achieved. In addition, the optical device may further include filter layers, and each of the filter layers disposed on parts of the pillar structures of each of the unit cells, or the different materials are implanted in the pillar structures, so as to inhibit the side bands of the corresponding pillar structure. Therefore, the accuracy of the optical device may be increased.

While the disclosure has been described by way of example and in terms of the preferred embodiments, it should be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. An optical device, comprising:
   a first conductive layer;
   a first junction layer, disposed on the first conductive layer;
   a light absorption layer, disposed on the first junction layer, wherein the light absorption layer comprises a plurality of unit cells, each of the unit cells comprises a plurality of pillar structures, and the pillar structures of each of the unit cells are different sizes;
   a second junction layer, disposed on the light absorption layer; and
   a second conductive layer, disposed on the second junction layer,
   wherein materials of the first conductive layer and the second conductive layer are indium tin oxide (ITO).

2. The optical device as claimed in claim 1, wherein materials of the pillar structures are an amorphous silicon (a-Si) and amorphous silicon impurities.

3. The optical device as claimed in claim 1, further comprising:
   a plurality of filter layers, each of the filter layers disposed on parts of the pillar structures of each of the unit cells;
   wherein the parts of the pillar structures of each of the unit cells have side bands less than a predetermined wavelength in a wavelength range of a light absorbed by the light absorption layer.

4. The optical device as claimed in claim 3, wherein each of the filter layers comprises a multi-film.

5. The optical device as claimed in claim 3, wherein the parts of the pillar structures of every two unit cells are arranged adjacent to each other.

6. The optical device as claimed in claim 3, wherein the wavelength range of the light absorbed by the light absorption layer is 450-700 nm, and the predetermined wavelength is 550 nm.

7. The optical device as claimed in claim 1, wherein materials of parts of the pillar structures of each of the unit cells are an amorphous silicon and amorphous silicon impurities, and materials of the other parts of the pillar structures of each of unit cells are a germanium (Ge) and germanium impurities, wherein the other parts of the pillar structures of each of the unit cells have side bands less than a predetermined wavelength in a wavelength range of a light absorbed by the light absorption layer.

8. The optical device as claimed in claim 7, wherein the wavelength range of the light absorbed by the light absorption layer is 450-700 nm, and the predetermined wavelength is 550 nm.

9. The optical device as claimed in claim 1, wherein a wavelength range of a light absorbed by the light absorption layer is 450-700 nm.

10. The optical device as claimed in claim 1, wherein a wavelength of a light absorbed by each of the pillar structures changes as the size of the pillar structure changes, wherein when the size of the pillar structure is large, the wavelength of the light absorbed by the pillar structure is large, and when the size of the pillar structure is small, the wavelength of the light absorbed by the pillar structure is small.

11. The optical device as claimed in claim 1, wherein the number of pillar structures of each of the unit cells is at least six.

12. The optical device as claimed in claim 11, wherein the number of pillar structures of each of the unit cells is twelve.

13. The optical device as claimed in claim 1, wherein a material of the first junction layer is a p-type amorphous silicon, and a material of the second junction layer is an n-type amorphous silicon.

14. The optical device as claimed in claim 1, further comprising:
   a substrate, disposed on a side of the first conductive layer opposite the first junction layer.

15. The optical device as claimed in claim 14, wherein a material of the substrate is a glass.

16. The optical device as claimed in claim 1, wherein a width of the size of each of the pillar structure is less than 0.5 um.

17. The optical device as claimed in claim 1, wherein a refractive index of each of the unit cells exhibits a W-shaped change.

18. The optical device as claimed in claim 1, wherein the sizes of the pillar structures are increased in series, and the pillar structure with a smallest size is adjacent to the pillar structure with a largest size.

* * * * *